May 13, 1958 J. C. ROBINSON 2,834,723

METHOD OF ELECTROPLATING PRINTED CIRCUITS

Filed Dec. 31, 1953

INVENTOR
JAMES ROBINSON

BY Bair, Freeman & Molinare

ATTORNEYS

United States Patent Office 2,834,723

Patented May 13, 1958

2,834,723

METHOD OF ELECTROPLATING PRINTED CIRCUITS

James C. Robinson, La Crosse, Wis., assignor to Northern Engraving & Manufacturing Co., La Crosse, Wis., a corporation of Wisconsin Application December 31, 1953, Serial No. 401,529

4 Claims. (Cl. 204—15)

This invention relates to an improved method for electroplating the conducting portions, or parts thereof, of a printed circuit having electrically separated circuit elements.

Printed circuits are conventionally formed by depositing a desired, electrically conducting design on an insulation base member or by etching the design through the metal layer on a metal clad insulating base. Typically, the base member is a plastic sheet, such as a phenol resin, and the circuit elements are formed thereon in a thin deposit by vacuum evaporation of metal, silk screening, or some similar process. While in this manner the printed circuit is defined on the base material, the thinness of the conducting deposit forming the circuit frequently precludes effective utilization thereof, either because of the electrical resistance of the thin deposit or because of the rapidity with which it is destroyed if contact elements ride over it. In either event, it is desirable to deposit a hard adherent material on the initial printed circuit, or at least portions thereof, to provide the requisite thick deposit having low resistance and the ability to withstand contact wiping.

One of the most effective ways to deposit metal on a formed printed circuit is by electroplating it. By this process, any of the common metals can be deposited and the original circuit conformation is maintained. However, when the printed circuit upon which the deposit is to be made has numerous separate parts not connected electrically, this method of increasing the thickness of the circuit elements is not practical because of the difficulty of establishing the requisite electrical contact with the various parts of the circuit.

In accord with the process described herein, this difficulty of electroplating a printed circuit is overcome. The portions of the circuit to be plated are first masked to define a protected area from which portions of each circuit part protrude. A conducting coating is then deposited over the areas not masked, thus forming a unitary, electrically conducting area including all parts of the printed circuit. The conducting coating is then covered with a non-conducting paint and the mask removed to expose the portions of the printed circuit to be plated. The plating operation is then conducted, using the conducting area formed by the conducting coating and the printed circuit as one electrode. After the necessary deposit has been made, the conducting coating and non-conducting paint are removed to restore the original circuit conformation.

It is, therefore, an object of the present invention to provide an improved method of plating on a printed circuit, or portions thereof, in which the circuit includes many electrically separate conducting areas.

A further object of the present invention is to provide an improved method of electroplating a printed circuit which can be applied in mass production operations.

Still another object of the present invention is to provide an improved method of simultaneously electroplating numerous electrically separated conducting areas on a printed circuit.

Another object of the present invention is to provide an improved method of electroplating a multi-part printed circuit which requires only one electrode connection and yet does not destroy the printed circuit conformation.

Still another object of the present invention is to provide a highly flexible process of electroplating a multipart printed circuit which can be used with a wide variety of masking and painting materials and without precise painting or printing methods.

The novel features which I believe to be characteristic of my invention are set forth with particularity in the appended claims. My invention, itself, however, together with further objects and advantages thereof, will best be understood by reference to the following description taken in connection with the accompanying drawings, in which:

Figure 1:
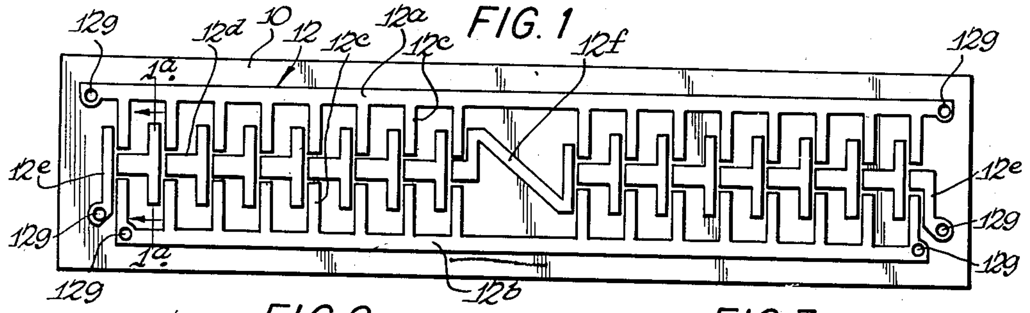
Figure 1 is a top plane view of a printed circuit of the type suitable for electroplating by the method of the present invention.

Referring now to Figure 1, there is shown a printed circuit which is formed on an elongated, rectangular plastic backing 10. The backing 10 may, for example, be a phenol resin, although it can be other plastic materials as well, as is well known in the art. The rectangular face defined by the backing 10 has formed thereon a printed circuit, indicated generally at 12. As will be evident from an examination of the figures, this printed circuit consists of two longitudinal headers **12*a* and 12*b*, each having a series of inwardly extending segments 12*c*. A series of T-shaped conducting segments 12*d* are located between the segments 12*c* as shown. At the ends of the printed circuit, and segments 12*e* are provided and in the central part a Z-shaped segment 12*f* is formed. Openings 12*g* are provided to receive rivets or other conducting members extending through the backing 10** to define circuit connections with the various parts of the printed circuit.

The printed circuit may be formed by any one of numerous methods well known in the art. It may, for example, be formed by silk screening a conducting medium onto the backing 10. In another method the printed circuit may be formed by vacuum evaporating a metal onto the base 10 through a suitable mask which defines the circuit conformation. Moreover, the printed circuit may simply be painted onto the backing 10. In any event, the printed circuit is formed in a comparatively thin layer of conducting material on the base 10.

In the use of the particular printed circuit shown in Figure 1, a wiper rides longitudinally of the backing member 10 and over the central portions of the printed circuit. This mechanical motion tends to wear away the circuit in this region and to result in its destruction. For this reason, it is desirable to provide a tough, comparatively thick, adherent, conducting deposit over these portions of the printed circuit. One particularly effective way of applying the requisite coating is by electroplating the portions of the circuit desired to be covered. However, to do this by conventional methods would entail an electrical connection to each of the separate conducting portions of the printed circuit. In the case of the structure of Figure 1, for example, this would involve connecting to each of the segments 12*d*, as well as parts 12*e*, 12*f*, 12*a*, and 12*b*. The process described hereafter avoids this cumbersome procedure.

Figures 2, 3:
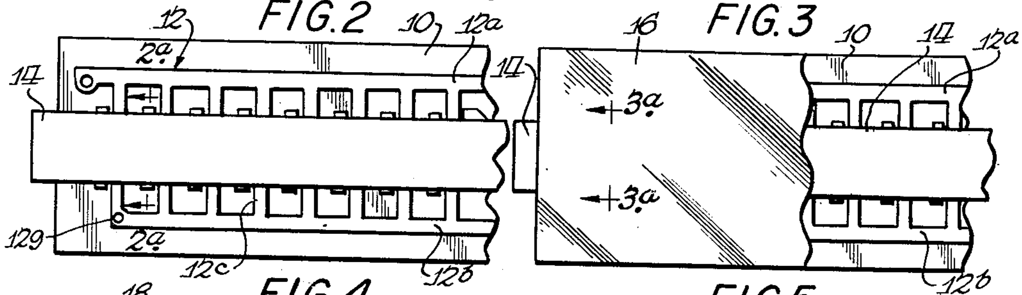
Figure 2 is a fragmentary view like Figure 1 but showing the first masking in place on the printed circuit and covering the areas to be electroplated.
Figure 3 is a view like Figure 2 showing the unit with the coating of conducting material placed thereon.
Figures 1A, 2A, 3A, 4A, 5A:
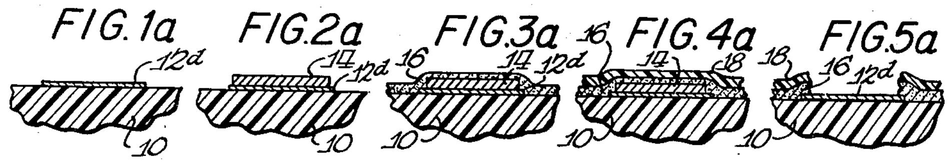
Figure 1A is a fragmentary, cross-sectional view through axis 1A—1A, Figure 1.
Figure 2A is a fragmentary, cross-sectional view through axis 2A—2A, Figure 2.
Figure 3A is a fragmentary, cross-sectional view through axis 3A—3A, Figure 3.
Figure 4A is a fragmentary, cross-sectional view through axis 4A—4A, Figure 4.
Figure 5A is a fragmentary, cross-sectional view through axis 5A—5A, Figure 5.

In the first step of the process, shown in Figure 2, the areas of the circuit to be plated are masked with a removable masking. This is accomplished by applying masking tape 14 along the length of the backing 10, as shown in Figure 2. As shown in Figure 2A, this tape extends over the central portions of the printed circuit, these portions being the path of travel of the moving contactor. Alternatively, the area to be plated may be coated with a liquid resist applied by silk screening, painting, or other suitable means, thus covering the area to be plated and protecting the same during the further steps of the process. Such a resist may be a plastic material in a vehicle which evaporates to leave a removable impervious coating or film, which may later be stripped from the backing 10 as described hereinbelow.

In the second step of the process, shown in Figures 3 and 3A, a conducting material is deposited over the entire face of the backing 10. This deposit, indicated at 16, may be removable conducting paint deposited by conventional painting methods. Preferably, however, the conducting layer 16 is in the form of a very fine mirror-like conductive film of silver or copper, deposited by vacuum evaporation, cathode sputtering, chemical deposition, or some other convenient process. In the view of Figure 3A, the thickness of the conducting deposit is exaggerated to show more clearly how it overlies the face of the base 10.

While in Figure 3 the conducting coating 16 is shown as covering the entire face of the base 10, it need not cover the masking 14. As a practical matter, however, it is usually most convenient to indiscriminately apply the coating to the entire face of the backing 10, especially if the coating is applied by vacuum evaporation, spray, or similar means.

Figures 4, 5:
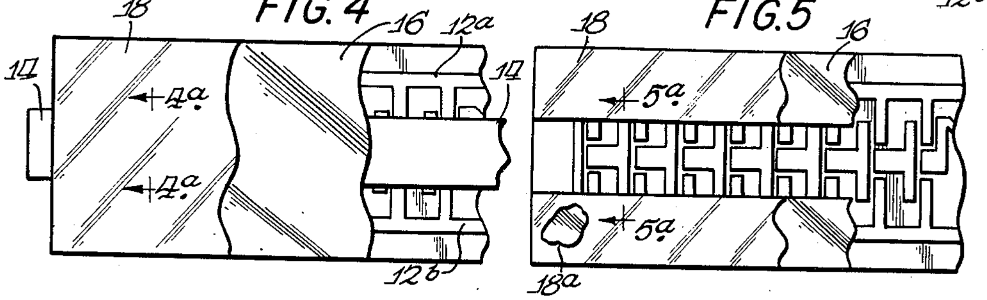
Figure 4 is a view like Figures 2 and 3 but showing the insulating deposit placed over the conducting coating shown in Figure 3.
Figure 5 is a view like Figures 2, 3, and 4, but showing the condition of the unit after the masking of Figure 2 has been removed to expose the portions of the circuit to be plated.

The conducting layer 16 is covered by a non-conducting resist, or mask 18, as shown in Figure 4. The purpose of this mask is to prevent plating of the conducting coating 16. It is applied over the surface of the coating 16 and, like coating 16, is most easily applied as a uniform coating over the entire surface of the backing 10. The coating 18 may be any one of the removable, non-conducting materials convenient for application over the conducting coating 16. A particular material that may, for example, be used is a varnish which dries to leave an impervious, non-conducting coating. Other materials sold for use as resists may, of course, be used.

After application of the coating 18, the mask 14 is removed, as shown in Figure 5. This tears away the portions of the coatings 16 and 18, which overlay the mask 14 and exposes the printed circuit, as shown in Figures 5 and 5A. It will be noted that when the mask 14 is removed, the portion of the printed circuit which is left exposed is that portion desired to be plated. Also, each portion of the printed circuit thus exposed extends slightly beneath the conducting coating 16 so that there is established a unitary area composed of the coating 16 and the portions 12*a*, 12*b*, 12*c*, 12*d*, 12*e*, and 12*f* of the printed circuit. In other words, the printed circuit, which in Figure 1 consists of a plurality of electrically independent areas, is a single unitary area in the structure of Figure 5 in so far as electrical characteristics are concerned.

The printed circuit is immersed in a plating bath when in the condition of Figures 5 and 5A. One of the conductors used for the plating process is connected to the common terminal defined by layer 16 and the printed circuit. This may, for example, be accomplished by removing the coating 18 in a fragmentary area, such as 18*a*, Figure 5, and clipping the electrical lead to that area. Alternatively, contact can be made through the body of the backing 10, using one of the openings 12*g*, Figures 1 and 7. In any event, only a single electrical connection need be made.

During the plating process, current flows between the exposed areas of the printed circuit and the plating solution, resulting in the deposition of metal upon the exposed printed circuit areas, these being the areas uncovered when the mask 14 is removed.

Figure 6:
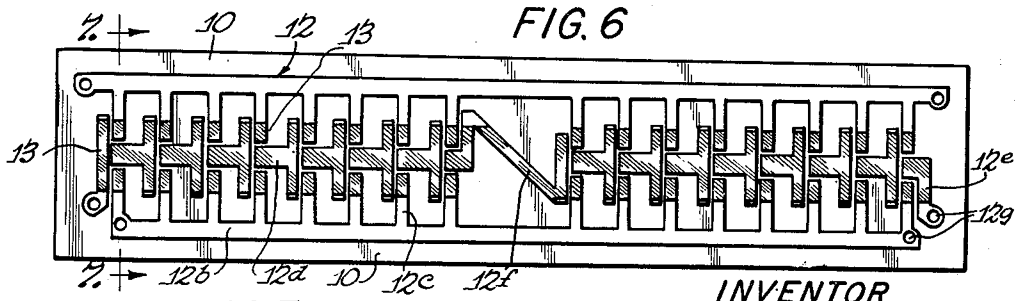
Figure 6 is a view like Figure 1 but showing the completed plated printed circuit.
Figure 7:
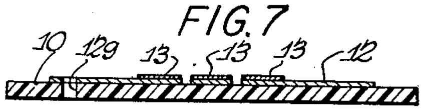
Figure 7 is a fragmentary, cross-sectional view through axis 7—7, Figure 6.

The final step in the process consists of removing the coatings 18 and 16 to provide the final structure of Figures 6 and 7. This removal can be achieved by using a suitable solvent for the materials from which these layers are made. For example, the common resists which may be used for the layer 18 can be removed by the use of a strong alkali solution, such as sodium hydroxide, or an organic solvent such as acetone or a commercial paint thinner. The material of the deposit 16 may be removed by the use of an acid, such as nitric acid. The resulting structure then consists of a base 10 with the same printed circuit conformation indicated at 12, Figure 6, as initially existed. In other words, the initial printed circuit is restored. However, in the areas, indicated at 13, Figure 6, where the printed circuit was exposed for plating, the printed circuit has an additional layer of plated metal. Thus, in the area defined by the initial masking 14, the deposit forming the printed circuit has been built up with a tough, adherent layer of electroplated material, all without requiring a plurality of electrical connections.

While I have shown and described specific embodiments of the present invention, it will, of course, be understood that numerous variations and alternatives may be used without departing from the true spirit and scope of the invention. It is intended, therefore, in the appended claims to cover all such changes and modifications as fall within the true spirit and scope.

What I claim as new and desire to secure by Letters Patent of the United States is:

1. The method of electro-plating the conducting elements of a multi-part printed circuit formed on the face of a non-conducting base, comprising the steps of: masking a fragmentary portion of each conducting element while leaving a fragment of each element exposed along the margin of the masked portion; covering the entire face with a removable electrically conducting coating; applying an electrically non-conducting coating over the electrically conducting coating; removing the first mask and the coatings thereon to expose the masked portion and define a unitary conducting area including the electrically conducting coating and the conducting elements of the printed circuit; electro-plating onto the face using the said conducting area as one electrode; and removing the remaining portions of the coatings to restore the original circuit configuration.

2. The method of electro-plating the conducting elements of a multi-part printed circuit formed on the face of a non-conducting base, comprising the steps of: masking a fragmentary portion of each conducting element while leaving a fragment of each element exposed along the margin of the masked portion; covering at least the unmasked portion of the face with a thin mirror-like metal coating to define a unitary conducting area including the metal coating and the printed circuit; applying an electrically insulating coating over at least the last mentioned coating; removing the first-mentioned masking to expose the previously masked portions of the printed circuit; plating onto the face using the said conducting area as one electrode; and removing the insulating coating and the metal coating to restore the original circuit configuration.

3. The method of electro-plating the conducting elements of a multi-part printed circuit formed on the face of a non-conducting base comprising the steps of: masking a fragmentary portion of each conducting element while leaving a fragment of each element exposed; covering at least the unmasked portion with a removable conducting coating, the coating making electrical contact with said conducting elements; applying a removable non-conducting coating over the conducting coating; removing said masking to expose the previously masked portions of the conducting elements; plating onto the face using the conducting coating and the exposed portions of the conducting elements as one electrode; and removing the coatings to restore the original circuit configuration.

4. The method of electro-plating the conducting elements of a multi-part printed circuit formed on the face of a non-conducting base comprising the steps of: taping a fragmentary portion of the conducting elements to mask same while leaving a fragment of each element exposed; covering at least the unmasked portion with a removable conducting coating, the coating making electrical contact with said conducting elements through said exposed fragments; applying a removable non-conducting coating over the conducting coating; removing said tape to expose the previously masked portions of the conducting elements; plating onto the face using the conducting coating and the exposed portions of the conducting elements as one electrode; and removing the coatings to restore the original circuit configuration.

References Cited in the file of this patent

UNITED STATES PATENTS

| | | |
|---|---|---|
| 716,306 | Strecker | Dec. 16, 1902 |
| 1,335,176 | Merrill | Mar. 30, 1920 |
| 1,647,474 | Seymour | Nov. 1, 1927 |
| 1,804,021 | Miller | May 5, 1931 |
| 2,443,119 | Rubin | June 8, 1948 |
| 2,666,008 | Euslein et al. | Jan. 12, 1954 |

FOREIGN PATENTS

| | | |
|---|---|---|
| 593,979 | Great Britain | Oct. 30, 1947 |